United States Patent [19]

Egawa et al.

[11] Patent Number: 5,061,983
[45] Date of Patent: Oct. 29, 1991

[54] SEMICONDUCTOR DEVICE HAVING A METAL SILICIDE LAYER CONNECTING TWO SEMICONDUCTORS

[75] Inventors: Hideharu Egawa, Tokyo; Yoshio Nishi; Kenji Maeguchi, both of Yokohama, all of Japan

[73] Assignee: Tokyo Shibaura Denki Kabushiki Kaisha, Kawasaki, Japan

[21] Appl. No.: 318,411

[22] Filed: Feb. 28, 1989

Related U.S. Application Data

[63] Continuation of Ser. No. 170,073, Mar. 15, 1988, abandoned, which is a continuation of Ser. No. 919,613, Oct. 14, 1986, abandoned, which is a continuation of Ser. No. 625,177, Jun. 27, 1984, abandoned, which is a continuation of Ser. No. 283,346, Jul. 14, 1981, abandoned.

[30] Foreign Application Priority Data

Jul. 15, 1980 [JP] Japan .................................. 55-96751

[51] Int. Cl.⁵ .................... H01L 29/04; H01L 27/02; H01L 23/48
[52] U.S. Cl. ......................................... 357/59; 357/42; 357/67; 357/71
[58] Field of Search ..................... 357/42, 59, 673, 715

[56] References Cited

U.S. PATENT DOCUMENTS

| | | | |
|---|---|---|---|
| 3,753,774 | 8/1973 | Veloric | 117/212 |
| 3,985,597 | 10/1976 | Zielinski | 156/11 |
| 4,178,605 | 12/1979 | Hsu et al. | 357/42 |
| 4,276,688 | 7/1981 | Hsu | 357/42 |
| 4,333,099 | 6/1982 | Tanguay et al. | 357/67 S |
| 4,469,527 | 9/1984 | Sugano et al. | 29/571 |
| 4,564,997 | 1/1986 | Matsuo et al. | 437/39 |
| 4,582,563 | 4/1986 | Hayuki et al. | 29/591 |

FOREIGN PATENT DOCUMENTS 2906249 8/1979 Fed. Rep. of Germany .

OTHER PUBLICATIONS

Edel et al., "Planarization of Metal Layers for Interconnections on Integrated Circuits", IBM Technical Disclosure Bulletin, vol. 14, No. 12, May '72.
Murarka, "Refractory Silicides for Integrated Circuits", J. Vac. Sci. Tech., 17(4) Jul./Aug. 1980.
Okada et al., "A New Polysilicon Process for a BiPolar Device-PSA Technology," IEEE Transactions on Electron Devices, vol. ED-26, No. 4, Apr., 1979, pp. 385-389.

*Primary Examiner*—Gene M. Munson
*Attorney, Agent, or Firm*—Finnegan, Henderson, Farabow, Garrett, and Dunner

[57] ABSTRACT

A method for manufacturing a semiconductor device that includes p- and n-type regions formed on an insulating substrate, and an interconnection layer electrically coupled with these p- and n-type regions. The interconnection layer is an n-type polycrystalline silicon layer which is electrically coupled with the p- and n-type regions through a metal silicide film formed between the interconnection layer and the p- and n-type regions.

1 Claim, 4 Drawing Sheets

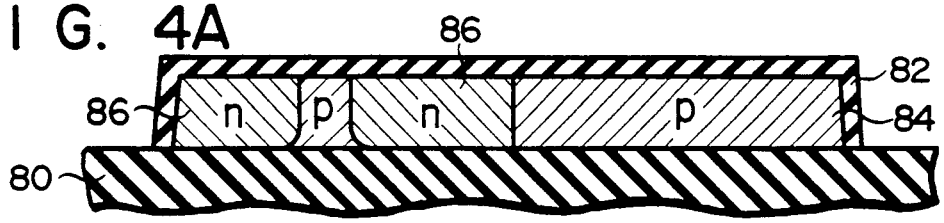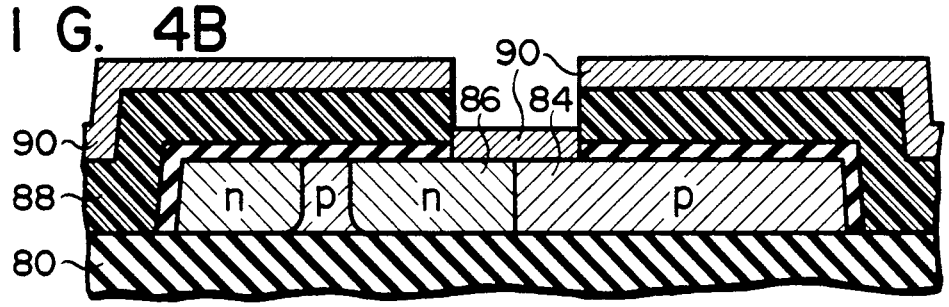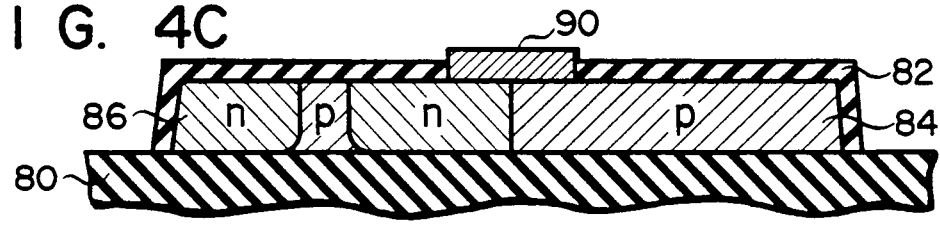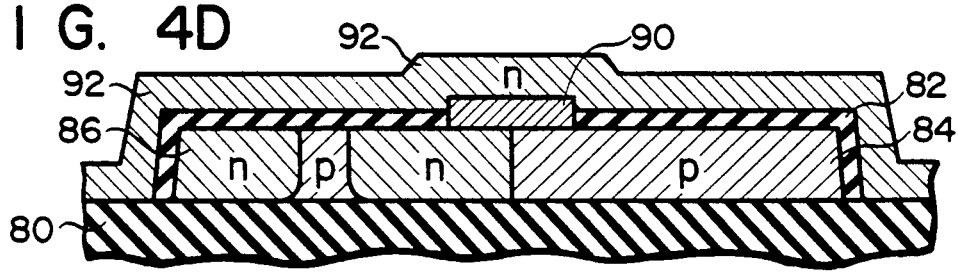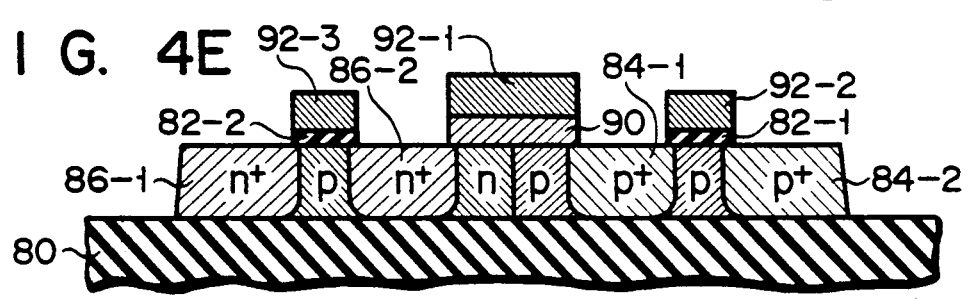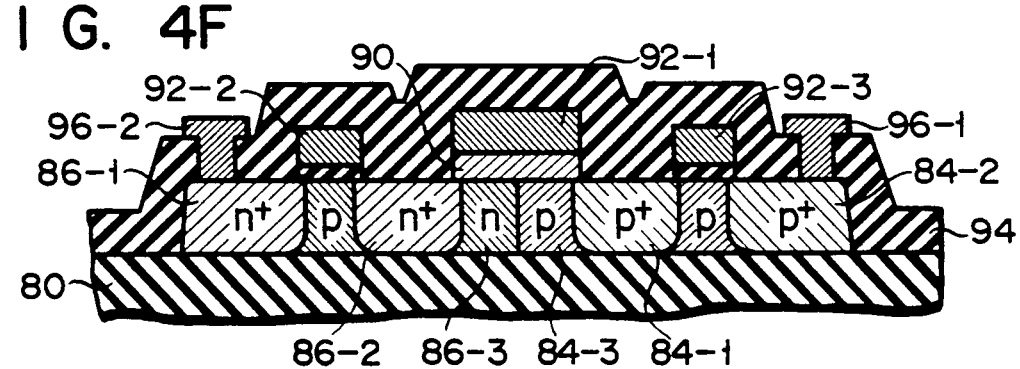

SEMICONDUCTOR DEVICE HAVING A METAL SILICIDE LAYER CONNECTING TWO SEMICONDUCTORS

This is a continuation of application Ser. No. 170,073 filed Mar. 15, 1988, which is a continuation of application Ser. No. 919,613 filed Oct. 14, 1986, which is a continuation of application Ser. No. 625,177 filed June 27, 1984, which is a continuation of application Ser. No. 283,346 filed July 14, 1981, all of which are now abandoned.

BACKGROUND OF THE INVENTION

This invention relates to a semiconductor device.

With the rapid progress of the technique for high density assembly of large scale integrated circuits (LSI), semiconductor memories have recently been used with such large capacity as 16K bits or 64K bits in the. While the large-capacity memories of this type are obtained by the use of semiconductor devices which are formed of single-channel MOS transistors, such as n-channel MOS transistors, 4K-bit or 16K-bit memories may also be formed of complementary MOS (CMOS) semiconductor devices which have conventionally been considered difficult to provide high density integration. These large-capacity memories in the field, however, are realized by reducing the size of the semiconductor devices and are greatly dependent upon improvements in the minute pattern transfer technique and not itself by improving the structure itself of the semiconductor element.

There still remains the restriction on the high density integration due to the coexistence of p- and n-channel MOS transistors inherent to the CMOS semiconductor devices for example. The gate electrodes of p- and n-channel MOS transistors of a CMOS semiconductor device, for example, are coupled by means of an aluminum interconnection layer, which, however, makes it difficult to realize multilayer interconnection. Accordingly, there is proposed a method in which the gate electrodes of the p- and n-channel MOS transistors are formed of polycrystalline layers of the same conductivity type, e.g. p-type, and these gate electrodes are coupled by means of a p-type polycrystalline silicon interconnection layer. In this case, however, an aluminum interconnection layer is required for the source and drain regions of the n-channel MOS transistor, eventually interfering with the achievement of high density integration.

Meanwhile, in a semiconductor device using an insulating substrate, such as a semiconductor device of, e.g., a silicon-on-sapphire (SOS) type, which has recently been attracting public attention, p- and n-type silicon layers can sometimes be formed in contact with each other on the insulating substrate. Further, there will be no latch-up phenomenon which will constitute a hindrance to the use of a semiconductor substrate, so that it is possible to provide a high-density LSI. In order to achieve high density integration, for example, a p-type inter-connection layer is directly connected only with the p-type silicon layer instead of coupling an aluminum interconnection layer with the p- and n-type silicon layers. In this case, however, a p-n junction formed between the p- and n-type silicon layers will possibly exert an influence upon the electrical properties of the semiconductor device.

SUMMARY OF THE INVENTION

An object of this invention is to provide a semiconductor device in which an interconnection layer of one conductivity type is satisfactorily electrically coupled with a semiconductor region of a different conductivity type.

According to an aspect of this invention, there is provided a semiconductor device which comprises a semiconductor region of one conductivity type, a layer of high-melting-point metal or metal silicide formed in electrical contact with the semiconductor region and an interconnection layer of a conductivity type opposite to that of the semiconductor region formed in electrical contact with the layer of high-melting-point metal or metal silicide.

According to this invention, the semiconductor region and interconnection layer of the different conductivity types can satisfactorily be electrically coupled with each other by means of the layer of high-melting-point metal or metal silicide. Thus, multilayer interconnection using, e.g., an aluminum interconnection layer will be made possible.

BRIEF DESCRIPTION OF THE DRAWINGS

FIGS. 4A to 4F are diagrams for illustrating steps of manufacturing a semiconductor device according to still another embodiment of the invention.

DETAILED DESCRIPTION OF THE PREFERRED EMBODIMENTS

Figure 1:
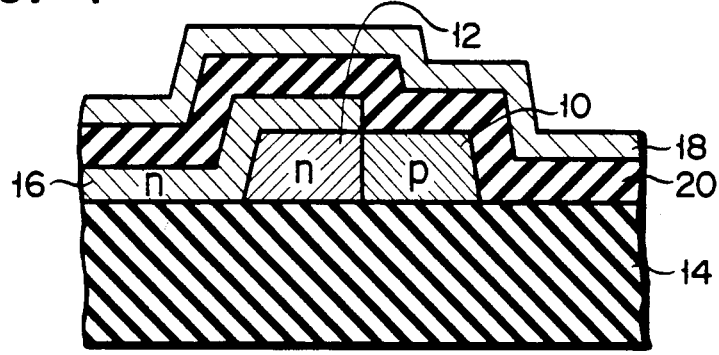
FIG. 1 is a sectional view of a prior art semiconductor device.

Referring first to the drawing of FIG. 1, the prior art semiconductor device will be described in further detail. The semiconductor device shown in FIG. 1 comprises p- and n-type silicon layers 10 and 12 formed on an insulating substrate 14, an interconnection layer of n-type polycrystalline silicon 16 formed in electrical contact with the n-type silicon layer 12, and an aluminum interconnection layer 18 formed over the interconnection layer 16 with an insulating layer 20 between them. In this semiconductor device, the interconnection layer 16 and the p-type silicon layer 10 are to be substantially electrically coupled with each other by bringing the interconnection layer 16 into electrical contact with the n-type silicon layer 12 on condition that no inverse bias voltage will be applied between the p- and n-type silicon layers 10 and 12. However, a voltage drop will be caused at the p-n junction between the p- and n-type silicon layers 10 and 12 to exert an influence upon the electrical properties of the semiconductor device.

In order to solve such a problem, according to this invention, a layer of high-melting-point metal or metal silicide is formed between an n-type interconnection layer and a p-type silicon region, for example, so that the n-type interconnection layer and the p-type silicon region are electrically coupled with each other by means of the layer of high-melting-point metal or metal silicide.

FIGS. 2A to 2F are diagrams showing a manufacturing process for a semiconductor device according to an embodiment of this invention.

Figure 2A:
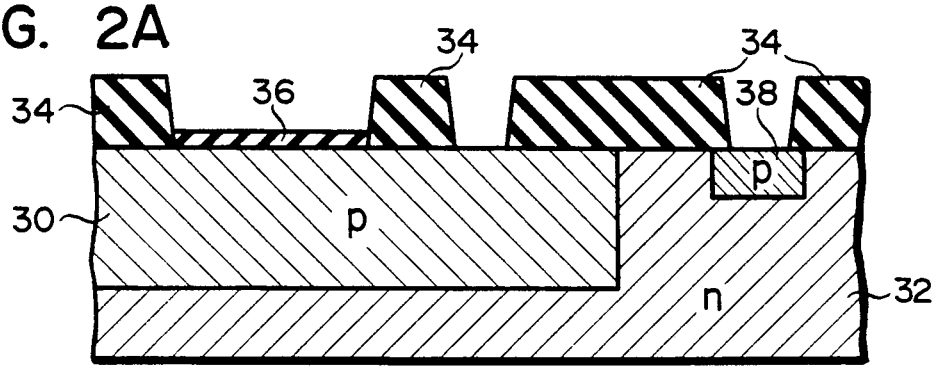
FIGS. 2A to 2F are diagrams for illustrating steps of manufacturing a semiconductor device according to an embodiment of this invention.

First, as shown in FIG. 2A, a p-well region 30 used for the formation of an n-channel MOS transistor is formed in an n-type silicon substrate 32 with crystal plane (100), and thereafter a relatively thick silicon oxide (SiO$_2$) layer 34 with a thickness of, e.g., 0.8$\mu$ is formed on the surfaces of the p-well region 30 and the silicon substrate 32 in wet O$_2$ atmosphere at a temperature of 1,000° C. Then, the SiO$_2$ layer 34 is selectively removed from positions corresponding to a region in which the transistor is expected to be formed and corresponding to interconnection regions. A thin SiO$_2$ film is formed all over the surface of the resultant semiconductor structure, and the SiO$_2$ film is selectively removed. Thus, a gate insulating layer 36 is formed. Then, boron is implanted into the silicon substrate 32 by ion implantation to form a p-type region 38.

Figure 2B:
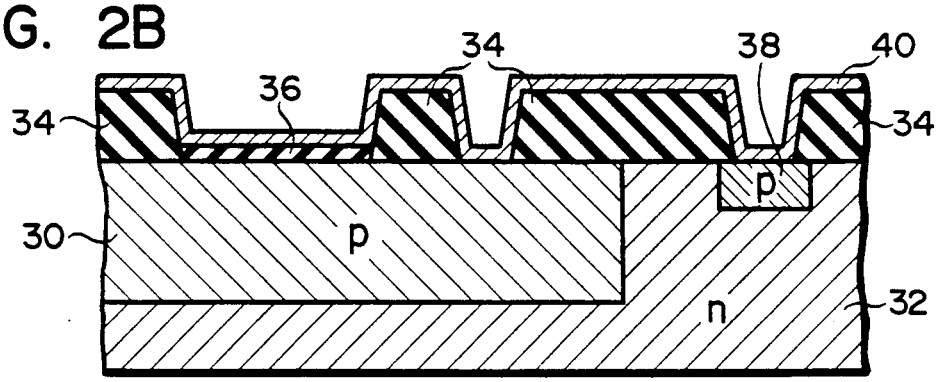

Subsequently, as shown in FIG. 2B, a molybdenum silicide (MoSi$_2$) film 40 is deposited to a thickness of approximately 1,000 Å all over the surface of the semiconductor structure shown in FIG. 2A. Thereafter, as shown in FIG. 2C, the MoSi$_2$ film 40 is removed except a contact region 41 which is in contact with the p-type region 38.

Figure 2C:
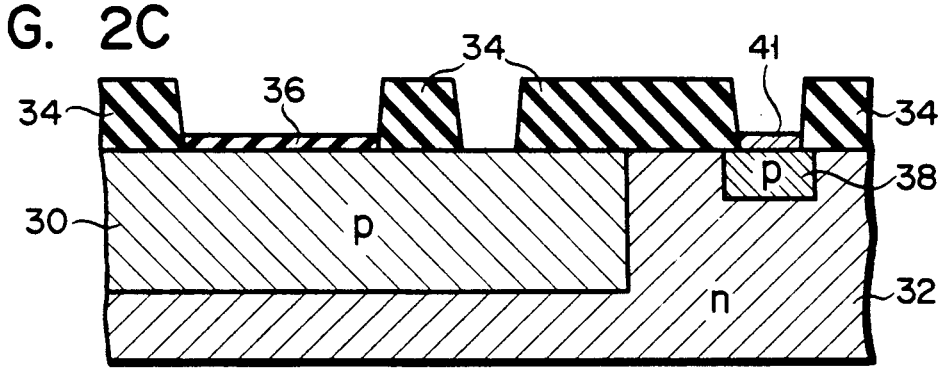
Figure 2D:
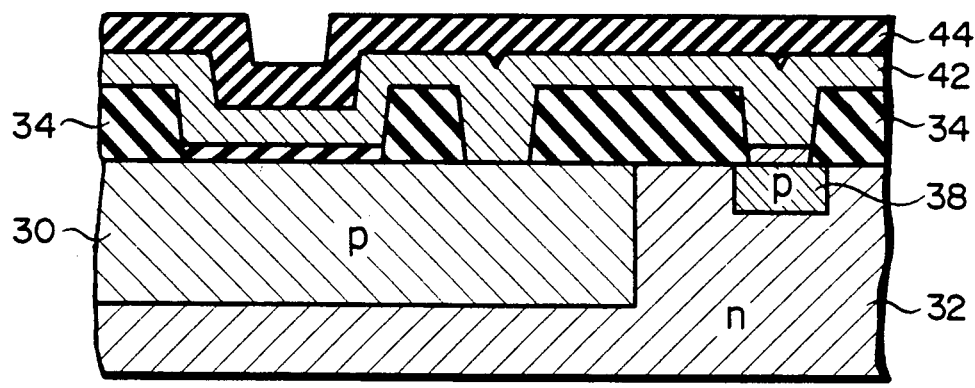

Then, as shown in FIG. 2D, a polycrystalline silicon layer 42 is deposited to a thickness of approximately 4,000 Å all over the surface of the semiconductor structure obtained in the step shown in FIG. 2C, and a phosphosilicate glass (PSG) layer 44 is formed on the polycrystalline silicon layer 42. Thereafter, phosphorus from the PSG layer 44 is diffused into the polycrystalline silicon layer 42 by solid-to-solid diffusion in high-temperature atmosphere, thereby reducing the resistance of the polycrystalline silicon layer 42.

Figure 2E:
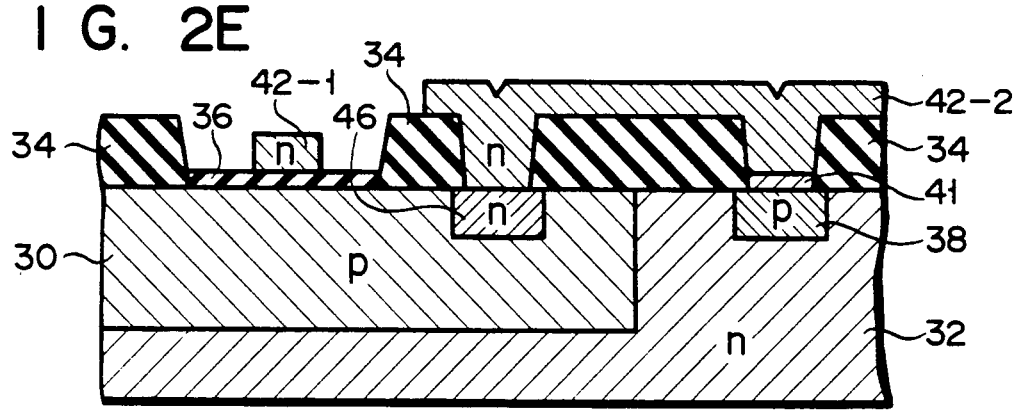

At the same time, the phosphorus from the PSG layer 44 is also diffused into part of the p-well region 30 which is in contact with the polycrystalline silicon layer 42, thereby forming an n-type region 46 in the surface area of the p-well region 30, as shown in FIG. 2E. Then, the PSG layer 44 is removed, and the polycrystalline silicon layer 42 is selectively removed to form an n-type polycrystalline silicon gate electrode 42-1 on the gate insulating layer 36, as well as an interconnection layer 45 of n-type polycrystalline silicon interconnection layer 42-2 which electrically couples the p- and n-type regions 38 and 46 together through the contact region of MoSi$_2$ film 41. Namely, the interconnection layer 42-2 is formed in ohmic contact with the MoSi$_2$ film 41 which is made in ohmic contact with the p-type region 38.

Thereafter, source and drain regions 48 and 50 of the n-channel MOS transistor are formed in the surface area of the p-well region 30 according to a conventional silicon gate MOS process, an SiO$_2$ layer 52 is formed by the chemical vapor deposition (CVD) method, contact holes are selectively formed in the SiO$_2$ layer 52, and an aluminum interconnection layer 54 is formed.

Figure 2F:
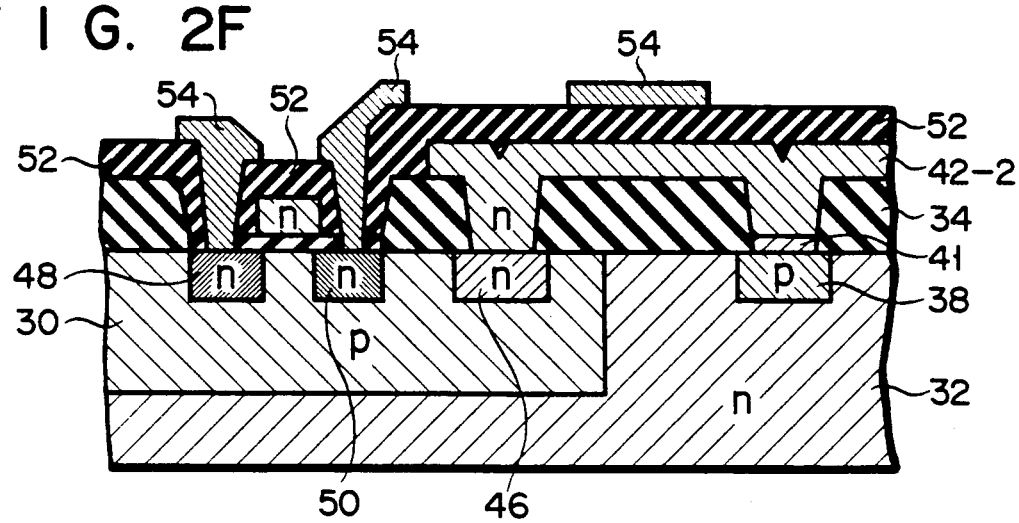

In this invention, as may be clearly understood from the semiconductor device thus completed, as shown in FIG. 2F, an interconnection layer of one conductivity type is brought into direct contact with a semiconductor region of the same conductivity type for electrical coupling, while it is electrically coupled with a semiconductor region of the opposite conductivity type through a region formed of metal, preferably high-melting-point metal or metal silicide. Thus, the p- and n-type semiconductor regions can be electrically coupled not by means of an aluminum interconnection layer but by means of a polycrystalline silicon interconnection layer. Furthermore, the aluminum interconnection layer can be formed over the polycrystalline silicon layer through an insulation layer so as to insulatively cross the same. Accordingly, the packing density of the semiconductor device may be greatly improved.

FIGS. 3A to 3E show an example of a method for electrically coupling an interconnection layer and a semiconductor region of different conductivity types by means of a high-melting-point metal or metal silicide film formed by the lift-off technique.

Figure 3A:
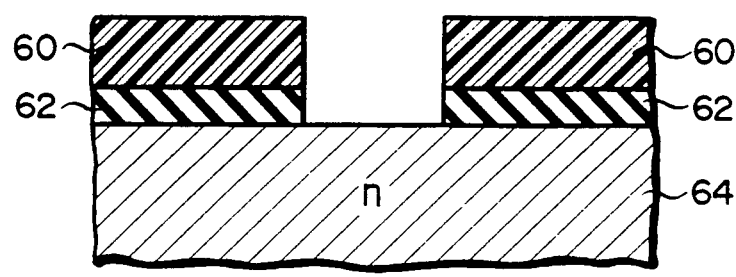
FIGS. 3A to 3E are diagrams for illustrating steps of manufacturing a semiconductor device according to another embodiment of the invention.
Figure 3B:
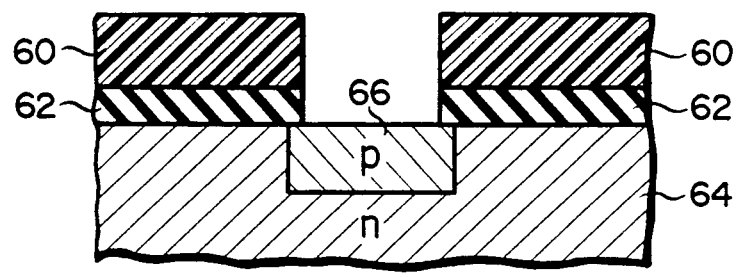
Figure 3C:
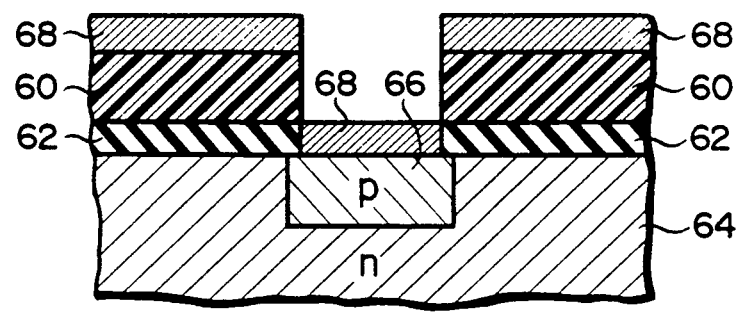

First, a thick photo-resist layer 60 is formed on an insulating layer 62, such as an SiO$_2$ layer, which is formed on a semiconductor substrate 64 of, e.g., n-type, as shown in FIG. 3A. Then, the photo-resist layer 60 and the insulating layer 62 are selectively removed by etching to form an opening and expose part of the surface of the substrate 64, as shown in FIG. 3B. Thereafter, an impurity is doped through the opening into the substrate 64 by, e.g., ion implantation to form a p-type region 66 in the surface area of the substrate 64, as shown in FIG. 3C. Then, a high-melting-point metal or metal silicide film 68 is formed all over the surface of the semiconductor structure obtained in FIG. 3C. Here, it is to be noted that the high-melting-point metal film or metal silicide film 68, which is sufficiently thinner than the photo-resist layer 60, is offset. That portion of the metal silicide film 68 which is formed on the p-type region 66 is physically separated from that portion of the film 68 which is formed on the photo-resist layer 60.

Figure 3D:
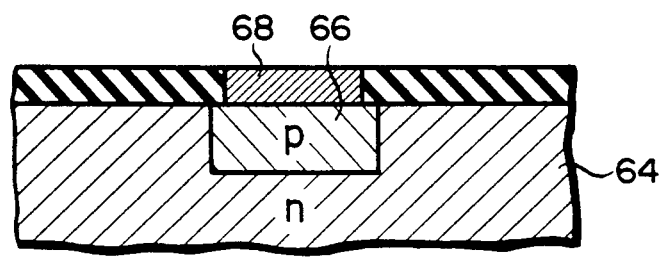

Subsequently, as shown in FIG. 3D, the photo-resist layer 60 is removed to remove the metal silicide film 68 thereon, leaving only the portion of the metal silicide film 68 formed on the p-type region 66 as it is. Thereafter, an interconnection layer 70 of n-type polycrystalline silicon is formed all over the surface of the semiconductor structure obtained in FIG. 3D. Thus, since the interconnection layer 70 is formed in ohmic contact with the metal silicide film 68 which is in ohmic contact with the p-type region 66, the interconnection layer 70 can be made in good electrical contact with the p-type region 66.

In this embodiment, the metal silicide film 68 has its portions on the semiconductor region 66 and on the photo-resist film 60 separated from each other by the lift-off technique, so that the portion of the metal silicide film 68 formed on the photo-resist film 60 can be removed without affecting the portion of the film 68 formed on the semiconductor region 66.

FIGS. 4A to 4F are diagrams showing a manufacturing process for a semiconductor device with an SOS structure according to a further embodiment of this invention.

First, as shown in FIG. 4A, a sapphire substrate 80 is prepared as an insulating substrate, and a silicon layer epitaxially grown on the sapphire substrate 80 is selectively removed by etching to form an island region of silicon. Then, a thin SiO$_2$ film 82, 1,000 Å thick, is formed on the silicon island region, and thereafter phosphorus and boron are selectively implanted through the SiO$_2$ film 82 into the silicon island region by the ion implantation method to form p- and n-type silicon layers 84 and 86. Subsequently, as shown in FIG. 4B, a photo-resist film 88 is formed over the semiconductor structure obtained in FIG. 4A, and then that portion of the photo-resist film 88 which corresponds to a contact region is removed to expose the surface of the p-n junction area between the p- and n-type silicon layers 84 and 86. Thereafter, a molybdenum silicide (MoSi$_2$) film 90 is formed on the exposed p-n junction area and the photo-resist film 88, and then the photo-resist film 88 is removed to remove the portion of the MoSi$_2$ film 90 thereon, leaving only the portion of the MoSi$_2$ film 90 formed on the p-n junction area as it is, as shown in FIG. 4C.

Subsequently, as shown in FIG. 4D, a poly-crystalline silicon layer is deposited to a thickness of 3,000 Å on the semiconductor structure obtained in FIG. 4C, and is doped with phosphorus to form a low-resistance, n-type polycrystalline silicon layer 92.

Thereafter, as shown in FIG. 4E, the n-type polycrystalline silicon layer 92 is selectively removed by etching to form an interconnection layer 92-1 on the MoSi$_2$ film 90 and gate electrode layers 92-2 and 92-3 in two gate regions, respectively, and the SiO$_2$ film 82 is selectively removed by etching to form gate insulating films 82-1 and 82-2. Thereafter, p$^+$-type source and drain 84-1 and 84-2 of a p-channel MOS transistor, as well as n$^+$-type source and drain 86-1 and 86-2 of an n-channel MOS transistor, are formed according to the conventional silicon gate process.

As shown in FIG. 4F, moreover, an SiO$_2$ layer 94 is formed on the semiconductor structure obtained in FIG. 4E, contact holes reaching the respective surfaces of the p$^+$-type drain 84-2 and n$^+$-type source 86-1 are formed in the SiO$_2$ layer 94, and then aluminum electrodes 96-1 and 96-2 electrically coupled with the p$^+$-type drain 84-2 and n$^+$-type source 86-1 through these contact holes are formed.

In the semiconductor device shown in FIG. 4F, the gate electrodes of the p- and n-channel MOS transistors are formed of the n-type polycrystalline silicon layers 92-2 and 92-3, respectively, and the source 84-1 of the p-channel MOS transistor and the drain 86-2 of the n-channel MOS transistor are coupled with the n-type polycrystalline silicon interconnection layer 92-1 through the p- and n-type regions 84-3 and 86-3 and the MoSi$_2$ film 90, so that aluminum interconnection layers for the aluminum electrodes 96-1 and 96-2 can be formed on the SiO$_2$ layer 94 and over the interconnection layer 92-1.

Although illustrative embodiments of this invention have been described in detail herein, it is to be understood that the invention is not limited to those precise embodiments, and that various changes and modifications may be effected therein by one skilled in the art without departing from the scope or spirit of the invention.

In the semiconductor device shown in FIG. 4F, for example, the n$^+$-type drain 86-2 is coupled with the n-type polycrystalline silicon interconnection layer 92-1 through the n-type region 86-3 and the MoSi$_2$ film 90. Alternatively, however, part of the MoSi$_2$ film 90 on the n-type region 86-3 may be removed so that the interconnection layer 92-1 may be coupled directly with the n-type region 86-3.

Although molybdenum silicide (MoSi$_2$) is used for the metal silicide in the above-mentioned embodiments, there may also be used titanium silicide (TiSi$_2$), tantalum silicide (TaSi$_2$) or tungsten silicide (WSi$_2$) for that purpose. These metal silicides may favorably be used in this invention because they are hardly affected by a high temperature used in high-temperature treatment or an acidic solution used in chemical treatment. Further, the metal silicide may be replaced with a high-melting-point metal, such as titanium (Ti), molybdenum (Mo), tantalum (Ta), or tungsten (W). If the influences of the high temperature and acidic solution are discounted, a conventional material such as aluminum may be substituted for the metal silicide. As shown in FIGS. 2C to 2F, for example, where the contact region 41 is defined by the SiO$_2$ layer 34 so that it should not flow out into other regions even if somewhat melted in high-temperature treatment, aluminum or some other conventional metal can be used for the formation of the contact region 41.

The interconnection layer of n-type polycrystalline silicon used in the above-mentioned embodiments may be replaced with an interconnection layer of p-type poly-crystalline silicon or an interconnection layer of p- or n-type monocrystalline silicon. In the semiconductor device shown in FIG. 2F, moreover, a film of high-melting-point metal or metal silicide may be provided between the n-type interconnection layer 42-2 and the n-type region 46 instead of directly coupling the layer 42-2 and the region 46.

Further, the sapphire substrate used in the embodiment shown in FIGS. 4A to 4F may be replaced with a substantially insulating substrate.

Figure 3E:
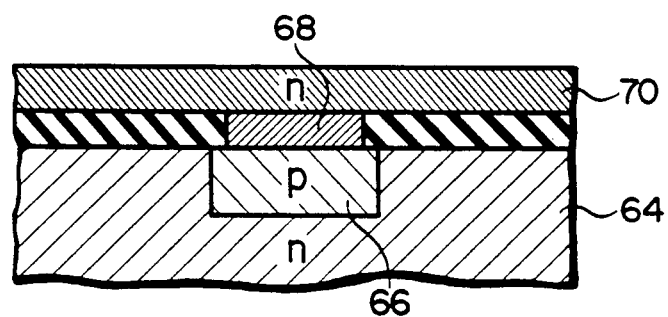

In FIGS. 3C to 3E, furthermore, the metal silicide film 68 may be formed thicker or thinner than the insulating layer 62.

What we claim is:

1. A semiconductor device comprising:
   a substrate formed of a semiconductor material of one conductivity type;
   a first semiconductor region of an opposite conductivity type formed on a surface area of said semiconductor substrate so that said first semiconductor region and the semiconductor substrate have a first common flat surface;
   an insulating layer formed on said substrate and said first semiconductor region to cover said substrate and said first semiconductor region, said insulating layer having a contact hole therein to expose an upper surface of said first semiconductor region;
   a conductive layer of metal silicide formed in said contact hole of said insulating layer to fill the contact hole of said insulating layer, said conductive layer having a thickness substantially the same as that of said insulating layer so that the insulating layer and the conductive layer have a second common flat surface; and
   a second semiconductor region formed of polycrystalline silicon of the first conductivity type formed on the second common flat surface of said insulating layer and conductive layer formed in said contact hole so that the first and second semiconductor regions are electrically connected via said conductive layer;
   said first semiconductor region, conductive layer and second semiconductor region being arranged in a thickness direction of said substrate in sequence recited herein.

* * * * *